(12) United States Patent
Nozawa et al.

(10) Patent No.: US 10,942,441 B2
(45) Date of Patent: Mar. 9, 2021

(54) MASK BLANK, PHASE SHIFT MASK, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Takenori Kajiwara, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 20 days.

(21) Appl. No.: 16/596,008

(22) Filed: Oct. 8, 2019

(65) Prior Publication Data

US 2020/0033718 A1  Jan. 30, 2020

Related U.S. Application Data

(63) Continuation of application No. 15/576,937, filed as application No. PCT/JP2016/078483 on Sep. 27, 2016, now Pat. No. 10,481,486.

(30) Foreign Application Priority Data

Sep. 30, 2015 (JP) ............................. JP2015-193314

(51) Int. Cl.
  *G03F 1/32* (2012.01)
  *G03F 1/54* (2012.01)

(52) U.S. Cl.
  CPC . *G03F 1/32* (2013.01); *G03F 1/54* (2013.01)

(58) Field of Classification Search
  CPC .................................... G03F 1/32; G03F 1/54
  USPC .......................................................... 430/5
  See application file for complete search history.

(56) References Cited

U.S. PATENT DOCUMENTS

| 6,569,577 | B1 | 5/2003 | Isao et al. |
| 2005/0019674 | A1 | 1/2005 | Okubo et al. |
| 2017/0285458 | A1 | 10/2017 | Shishido et al. |

FOREIGN PATENT DOCUMENTS

| JP | 2001-201842 A | 7/2001 |
| JP | 2010-217514 A | 9/2010 |
| JP | 2014-145920 A | 8/2014 |
| WO | 2004/090635 A1 | 10/2004 |
| WO | 2016/103843 A1 | 6/2016 |

OTHER PUBLICATIONS

U.S. Appl. No. 15/576,937, "Notice of Allowance", dated Jul. 15, 2019, 7 pages.
PCT/JP2016/078483, "International Search Report", dated Dec. 20, 2016.

*Primary Examiner* — Christopher G Young
(74) *Attorney, Agent, or Firm* — Kilpatrick Townsend & Stockton LLP

(57) ABSTRACT

A mask blank having a phase shift film and a light shielding film laminated on a transparent substrate. The phase shift film transmits ArF exposure light at a transmittance of from 2% to 30% and generates a phase difference of from 150° to 200°, is formed from a material containing Si and not substantially containing Cr, and has a lower layer (L) and an upper layer (U) laminated from the transparent substrate side. A refractive index n for layer L is below that of the substrate while n for layer U is higher, and layer L has an extinction coefficient k higher than that of layer U. The light shielding film includes a layer in contact with the phase shift film that is formed from a material containing Cr, has a n lower than that of layer U, and has an extinction coefficient k higher than that of layer U.

25 Claims, 2 Drawing Sheets

MASK BLANK, PHASE SHIFT MASK, AND METHOD FOR MANUFACTURING SEMICONDUCTOR DEVICE

CROSS REFERENCE TO RELATED APPLICATIONS

This application is a continuation of U.S. patent application Ser. No. 15/576,937, filed Nov. 27, 2017, the contents of which is incorporated herein by reference in its entirety and which is a National Stage application of International Application No. PCT/JP2016/078483 filed Sep. 27, 2016, the contents of which is incorporated herein by reference in its entirety and which claims priority to Japanese Patent Application No. 2015-193314, filed Sep. 30, 2015.

TECHNICAL FIELD

The present disclosure relates to a mask blank and a phase shift mask manufactured using the mask blank. The present disclosure also relates to a method for manufacturing a semiconductor device using the phase shift mask.

BACKGROUND ART

Generally, in a manufacturing process of a semiconductor device, photolithography is used to form a fine pattern. Multiple substrates called transfer masks are usually utilized in forming the fine pattern. In miniaturization of a semiconductor device pattern, it is necessary to shorten the wavelength of an exposure light source used in the photolithography, in addition to miniaturization of a mask pattern formed in the transfer mask. Shortening of wavelength has been advancing recently from the use of KrF excimer lasers (wavelength: 248 nm) to ArF excimer lasers (wavelength: 193 nm) as exposure light sources in the manufacture of semiconductor devices.

As for the types of the transfer mask, a half tone phase shift mask is known in addition to a conventional binary mask having a light shielding pattern made of a chromium-based material on a transparent substrate. Molybdenum silicide (MoSi)-based materials are widely used for a phase shift film of the half tone phase shift mask. However, as disclosed in Patent Document 1, it has been discovered recently that a MoSi-based film has low resistance to exposure light of an ArF excimer laser (so-called ArF light fastness). In Patent Document 1, the ArF light fastness of the MoSi-based film is enhanced by subjecting the MoSi-based film after formation of a pattern to a plasma treatment, a UV irradiation treatment, or a heat treatment to form a passivation film on a surface of the pattern of the MoSi-based film.

In the half tone phase shift mask, a light shielding band is often provided in a peripheral portion around a transfer pattern forming region where a phase shift pattern is formed. Even within the transfer pattern forming region, a relatively large-size phase shift pattern may have a smaller light shielding pattern laminated thereon. Patent Document 2 discloses a mask blank for manufacturing a half tone phase shift mask, which has a thin film structure including, from the substrate side, a metal silicide-based transfer mask film (light semitransmissive film), a light shielding film formed from a chromium-based compound, and a hard mask film formed from a silicon compound.

PRIOR ART DOCUMENTS

Patent Documents

Patent Document 1: Japanese Patent Application Publication 2010-217514

Patent Document 2: International Publication WO 2004/090635

SUMMARY OF THE DISCLOSURE

Problems to be Solved by the Disclosure

As described in Patent Document 2, a half tone phase shift mask typically includes a structure in which a half tone phase shift film (hereinafter referred to simply as a phase shift film) having a transfer pattern (phase shift pattern) formed therein and a light shielding film having a light shielding pattern such as a light shielding band formed therein are laminated in this order on a transparent substrate. Such a phase shift mask is manufactured using a mask blank having a structure in which a phase shift film and a light shielding film are laminated in this order on a transparent substrate. When manufacturing a phase shift mask using this mask blank, it is necessary to form different patterns in the phase shift film and the light shielding film. Thus, materials with different dry etching characteristics should be used for the phase shift film and the light shielding film, respectively.

The phase shift film needs to have a function to transmit ArF exposure light at a predetermined transmittance, and a function to generate a predetermined phase difference between the ArF exposure light transmitted through the phase shift film and the ArF exposure light transmitted through the air for the same distance as a thickness of the phase shift film. A material containing silicon can be easily adjusted to have optical properties suitable for forming the phase shift film having these functions. In particular, transition metal silicide-based materials are widely used for a phase shift film. If the material containing silicon is used for a phase shift film, a material containing chromium is often used as a material of a light shielding film. If the light shielding film is a multilayer film, the material containing chromium may be used for a layer in contact with the phase shift film (this layer may be regarded as an etching stopper film, i.e., another functional film). This is because a thin film formed from the material containing chromium and a thin film formed from the material containing silicon have high etching selectivity with respect to one another during the patterning by dry etching.

When a phase shift mask is set on a mask stage of an exposure apparatus to exposure-transfer a transfer pattern to a transfer target object such as a resist film on a semiconductor substrate, exposure light is typically irradiated from the transparent substrate side of the phase shift mask. As for the phase shift mask which includes the phase shift film formed from the material containing silicon and the light shielding film formed from the material containing chromium (also including a light shielding film having a layer in contact with the phase shift film that is formed from the material containing chromium) as described above, it was newly found that a phenomenon that chromium atoms in the light shielding film move into the material containing silicon which forms the phase shift film, so-called chromium migration, occurs when the exposure transfer with the exposure apparatus is repeated, which is problematic.

If a large-size pattern of a phase shift film is placed in a phase shift mask, a smaller pattern of a light shielding film may be provided on the large-size pattern. In this case, occurrence of chromium migration has a particularly significant influence. When the phase shift mask set on a mask stage of an exposure apparatus is irradiated with ArF exposure light, and chromium atoms in the light shielding film are excited to cause many chromium atoms to move into the pattern of the phase shift film, the transmittance of the phase shift film is decreased. In a half tone phase shift film, decrease in transmittance leads to reduction in phase shift effect generated between exposure light transmitted through a phase shift pattern and exposure light transmitted through a transparent portion, which becomes problematic. The chromium atoms moved into the phase shift film may deposit onto side walls of the pattern of the phase shift film and exert a bad influence on a pattern image of the exposure light transmitted through the phase shift mask. Further, the chromium atoms moved into the phase shift film may deposit on a surface of a transparent substrate that is the transparent portion, which may cause fogging in the transparent portion (decrease in transmittance of the transparent portion).

Thus, the present disclosure was made to solve the existing problems. That is, an aspect of the present disclosure is to provide a mask blank which includes a phase shift film and a light shielding film laminated in this order on a transparent substrate, wherein the phase shift film is formed from a material containing silicon and not substantially containing chromium, and a layer of the light shielding film at least in contact with the phase shift film is formed from a material containing chromium, nevertheless, if a phase shift mask manufactured from this mask blank is used for exposure transfer with an exposure apparatus, occurrence of chromium migration is significantly suppressed. A further aspect is to provide a phase shift mask manufactured using this mask blank. Yet another aspect of the present disclosure is to provide a method for manufacturing a semiconductor device using such a phase shift mask.

Means for Solving the Problems

In order to solve the above problems, the present disclosure includes the following structures.

Structure 1

A mask blank having a structure in which a phase shift film and a light shielding film are laminated in this order on a transparent substrate, wherein the phase shift film has a function to transmit exposure light of an ArF excimer laser at a transmittance of not less than 2% and not more than 30%, and a function to generate a phase difference of not less than 150 degrees and not more than 200 degrees between the exposure light transmitted through the phase shift film and the exposure light transmitted through air for the same distance as a thickness of the phase shift film, wherein the phase shift film is formed from a material containing silicon and not substantially containing chromium, and includes a structure in which a lower layer and an upper layer are laminated from the transparent substrate side, wherein the lower layer has a refractive index n lower than the transparent substrate at a wavelength of the exposure light, wherein the upper layer has a refractive index n higher than the transparent substrate at a wavelength of the exposure light, wherein the lower layer has an extinction coefficient k higher than the upper layer at a wavelength of the exposure light, wherein the light shielding film includes a layer in contact with the phase shift film, and wherein the layer in contact with the phase shift film is formed from a material containing chromium, has a refractive index n lower than the upper layer at a wavelength of the exposure light, and has an extinction coefficient k higher than the upper layer at a wavelength of the exposure light.

Structure 2

The mask blank according to Structure 1, wherein the upper layer has a thickness greater than the lower layer.

Structure 3

The mask blank according to Structure 1 or 2, wherein the lower layer has a thickness of less than 10 nm.

Structure 4

The mask blank according to any one of Structures 1 to 3, wherein the refractive index n of the lower layer is 1.5 or less.

Structure 5

The mask blank according to any one of Structures 1 to 4, wherein the refractive index n of the upper layer is greater than 2.0.

Structure 6

The mask blank according to any one of Structures 1 to 5, wherein the refractive index n of the layer in contact with the phase shift film is 2.0 or less.

Structure 7

The mask blank according to any one of Structures 1 to 6, wherein the extinction coefficient k of the lower layer is 2.0 or more.

Structure 8

The mask blank according to any one of Structures 1 to 7, wherein an extinction coefficient k of the upper layer is 0.8 or less.

Structure 9

The mask blank according to any one of Structures 1 to 8, wherein the extinction coefficient k of the layer in contact with the phase shift film is 1.0 or more.

Structure 10

The mask blank according to any one of Structures 1 to 9, wherein the lower layer is formed in contact with a surface of the transparent substrate.

Structure 11

The mask blank according to any one of Structures 1 to 10, wherein the upper layer has in its surface layer a layer having an oxygen content higher than in the portion of the upper layer excluding the surface layer.

Structure 12

The mask blank according to any one of Structures 1 to 11, wherein a back-surface reflectance to the exposure light entering from the transparent substrate side is 30% or more.

Structure 13

A phase shift mask having a structure in which a phase shift film having a transfer pattern formed therein and a light shielding film having a light shielding pattern formed therein are laminated in this order on a transparent substrate,
wherein the phase shift film has a function to transmit exposure light of an ArF excimer laser at a transmittance of not less than 2% and not more than 30%, and a function to generate a phase difference of not less than 150 degrees and not more than 200 degrees between the exposure light transmitted through the phase shift film and the exposure light transmitted through air for the same distance as a thickness of the phase shift film,
wherein the phase shift film is formed from a material containing silicon and not substantially containing chromium, and includes a structure in which a lower layer and an upper layer are laminated from the transparent substrate side,
wherein the lower layer has a refractive index n lower than the transparent substrate at a wavelength of the exposure light,
wherein the upper layer has a refractive index n higher than the transparent substrate at a wavelength of the exposure light,
wherein the lower layer has an extinction coefficient k higher than the upper layer at a wavelength of the exposure light,
wherein the light shielding film includes a layer in contact with the phase shift film, and
wherein the layer in contact with the phase shift film is formed from a material containing chromium, has a refractive index n lower than the upper layer at a wavelength of the exposure light, and has an extinction coefficient k higher than the upper layer at a wavelength of the exposure light.

Structure 14

The phase shift mask according to Structure 13, wherein the upper layer has a thickness greater than the lower layer.

Structure 15

The phase shift mask according to Structure 13 or 14, wherein the lower layer has a thickness of less than 10 nm.

Structure 16

The phase shift mask according to any one of Structures 13 to 15, wherein the refractive index n of the lower layer is 1.5 or less.

Structure 17

The phase shift mask according to any one of Structures 13 to 16, wherein the refractive index n of the upper layer is greater than 2.0.

Structure 18

The phase shift mask according to any one of Structures 13 to 17, wherein the refractive index n of the layer in contact with the phase shift film is 2.0 or less.

Structure 19

The phase shift mask according to any one of Structures 13 to 18, wherein the extinction coefficient k of the lower layer is 2.0 or more.

Structure 20

The phase shift mask according to any one of Structures 13 to 19, wherein an extinction coefficient k of the upper layer is 0.8 or less.

Structure 21

The phase shift mask according to any one of Structures 13 to 20, wherein the extinction coefficient k of the layer in contact with the phase shift film is 1.0 or more.

Structure 22

The phase shift mask according to any one of Structures 13 to 21, wherein the lower layer is formed in contact with a surface of the transparent substrate.

Structure 23

The phase shift mask according to any one of Structures 13 to 22, wherein the upper layer has in its surface layer a layer having an oxygen content higher than in the portion of the upper layer excluding the surface layer.

Structure 24

The phase shift mask according to any one of Structures 13 to 23, wherein a back-surface reflectance to the exposure light entering from the transparent substrate side is 30% or more.

Structure 25

A method for manufacturing a semiconductor device including a step of using the phase shift mask according to any one of Structures 13 to 24 and exposure-transferring a transfer pattern to a resist film on a semiconductor substrate.

Effect of the Disclosure

The mask blank according to the present disclosure includes a phase shift film and a light shielding film laminated in this order on a transparent substrate, the phase shift film is formed from a material containing silicon and not substantially containing chromium, and a layer of the light shielding film at least in contact with the phase shift film is formed from a material containing chromium. Nevertheless, if a phase shift mask manufactured from this mask blank is used for the exposure transfer with an exposure apparatus, occurrence of chromium migration, which is a phenomenon that chromium atoms in the light shielding film move into the phase shift film, can be significantly suppressed.

DESCRIPTION OF THE EMBODIMENTS

Figure 1:
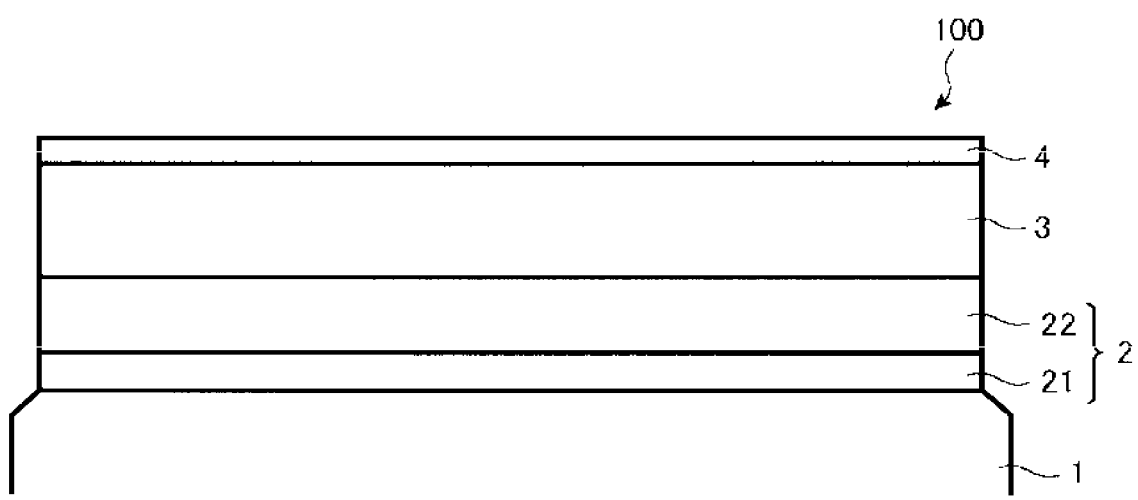
FIG. 1 is a cross-sectional view showing a structure of a mask blank according to an embodiment of the present disclosure.

The embodiments of the present disclosure are explained below. Regarding a phase shift mask which includes a phase shift film formed from a material containing silicon and a light shielding film formed from a material containing chromium laminated on a transparent substrate, the inventors made diligent studies on a means of suppressing the occurrence of a phenomenon that chromium atoms in the light shielding film move into the material containing silicon constituting the phase shift film, i.e., chromium migration. The inventors found that the chromium migration occurs due to photoexcitation of silicon in the phase shift film and chromium in the light shielding film by ArF exposure light.

While ArF exposure light entering an interior of the transparent substrate of the phase shift mask is partially reflected at an interface between a main surface of the substrate and a pattern of the phase shift film, the ArF exposure light largely enters an interior of the phase shift film. The phase shift film needs to have a function to transmit the ArF exposure light at a predetermined transmittance. Thus, the phase shift film has an optical property of absorbing most of the ArF exposure light entering the interior of the phase shift film. Respective atoms of silicon and transition metal constituting the phase shift film which has absorbed energy of the ArF exposure light are photoexcited by absorbing the energy.

In a region of the phase shift mask where a pattern of the light shielding film is laminated on a pattern of the phase shift film, while the ArF exposure light transmitted through the phase shift film is partially reflected at an interface between the phase shift film and the light shielding film, the remainder enters an interior of the light shielding film. Then, most of the ArF exposure light is absorbed within the light shielding film, and an amount of ArF exposure light exiting from the light shielding film is very small (for example, attenuation to the light amount of 0.01% relative to the amount of ArF exposure light before entering the phase shift film). At this time, within the light shielding film, chromium atoms absorb the energy of ArF exposure light, and are photoexcited.

When the chromium atoms in the light shielding film and constituent elements in the phase shift film are photoexcited, the chromium atoms photoexcited within the light shielding film are prone to enter the interior of the phase shift film. As described above, the design concept of the conventional phase shift film is configured such that the ArF exposure light is absorbed within the phase shift film to control the transmittance. The light shielding film also has a similar design concept. With the design concept of the conventional phase shift film and light shielding film, a ratio of atoms photoexcited upon irradiation of the ArF exposure light among all atoms constituting the films becomes inevitably high, and thus, it is difficult to suppress the occurrence of chromium migration.

The inventors considered that the ratio of silicon atoms photoexcited by the ArF exposure light among all the silicon atoms constituting the phase shift film may be decreased by increasing a reflectance (back-surface reflectance) at an interface between the transparent substrate and the phase shift film compared to conventional phase shift films so as to achieve a predetermined transmittance value of the phase shift film to the ArF exposure light. When the ArF exposure light enters the phase shift film from the transparent substrate side, an amount of exposure light entering the interior of the phase shift film can be reduced by increasing the amount of ArF exposure light reflected at the interface between the transparent substrate and the phase shift film by more than what has been conventionally done. This allows the amount of ArF exposure light exiting from the phase shift film to be equivalent to that of the conventional phase shift film, even if the amount of ArF exposure light absorbed in the phase shift film is reduced by more than what has been conventionally done. As a result, the inventors found that the silicon atoms are less likely to be photoexcited within the phase shift film, so that movement of photoexcited chromium atoms from the light shielding film into the phase shift film can be suppressed.

Additionally, the inventors considered that the ratio of chromium atoms photoexcited by the ArF exposure light among all the chromium atoms constituting the light shielding film may be decreased by increasing a reflectance (back-surface reflectance) at the interface between the phase shift film and the light shielding film compared to the conventional case so as to ensure light shielding performance of the light shielding film for the ArF exposure light. The amount of exposure light entering an interior of the light shielding film can be reduced by increasing the amount of ArF exposure light reflected at the interface between the phase shift film and the light shielding film by more than what has been conventionally done. This allows for the light shielding film to have the light shielding performance equivalent to the conventional light shielding film, even if the amount of ArF exposure light absorbed in the light shielding film is reduced by more than what has been conventionally done. As a result, the inventors found that the chromium atoms are less likely to be photoexcited within the light shielding film, so that movement of the chromium atoms into the phase shift film can be suppressed.

Then, the inventors first examined the increase of reflectance at the interface between the phase shift film and the transparent substrate such that it becomes higher than in the conventional phase shift film. In order to increase the back-surface reflectance of the phase shift film provided on the transparent substrate, a layer of the phase shift film at least in contact with the transparent substrate should be formed from a material having a high extinction coefficient k at a wavelength of ArF exposure light (the extinction coefficient k at a wavelength of ArF exposure light is hereinafter referred to simply as an extinction coefficient k). The phase shift film of a single layer structure is typically formed from a material which has a high refractive index n at a wavelength of ArF exposure light (the refractive index n at a wavelength of ArF exposure light is hereinafter referred to simply as a refractive index n) and a low extinction coefficient k, since it is necessary to satisfy the required optical properties and thickness. Then, the inventors examined the increase of back-surface reflectance of the phase shift film by adjusting composition of a material forming the phase shift film to significantly increase the extinction coefficient k. Since this adjustment causes the phase shift film to fail to satisfy the conditions of transmittance within a predetermined range, it becomes necessary to significantly reduce the thickness of the phase shift film. However, if the thickness of the phase shift film is reduced, the phase shift film cannot satisfy the conditions of phase difference within a predetermined range. Since there is a limit to the increase of refractive index n of the material forming the phase shift film, it is difficult to increase the back-surface reflectance in a single-layer phase shift film.

Then, based on the design concept that the phase shift film is a laminated structure including a lower layer and an upper layer and the back-surface reflectance is increased in the entire laminated structure, the inventors made a further study. For the upper layer of the phase shift film on the side away from the transparent substrate, they decided to apply a material having a high refractive index n and a low extinction coefficient k, as in the conventional single-layer phase shift film. On the other hand, for the lower layer of the phase shift film located on the transparent substrate side, they decided to apply a material having a higher extinction coefficient k than the material of the conventional phase shift film. Since such a lower layer functions to decrease the transmittance of the phase shift film, it becomes necessary to reduce the thickness of the lower layer. When the thickness of the lower layer is reduced, an amount of exposure light transmitted through the lower layer increases, and thus, the back-surface reflectance is decreased. Consequently, the inventors decided to make the refractive index n of the lower layer less than that of the transparent substrate in order to further increase the back-surface reflectance. The inventors found that this makes a large difference in refractive index n between the lower layer and the upper layer, and increases an amount of exposure light reflected at an interface between the lower layer and the upper layer, and thus the back-surface reflectance of the phase shift film can be increased.

Next, the inventors examined the increase of reflectance to the ArF exposure light at the interface between the phase shift film and the light shielding film. A common method for increasing the reflectance is to form a layer of the light shielding film in contact with the upper layer of the phase shift film from a material having a refractive index n higher than the upper layer of the phase shift film. The material having a refractive index n higher than the upper layer of the phase shift film should have a high nitrogen content. However, since the material having a high nitrogen content tends to have a low extinction coefficient k, it is not favorable to a layer forming the light shielding film. In view of this matter, the inventors decided to form the layer of the light shielding film in contact with the upper layer of the phase shift film from a material that has a high extinction coefficient k and a low refractive index n relative to the phase shift film. In this way, even a light shielding film with a small thickness can ensure sufficient light shielding performance while achieving a high reflectance to the ArF exposure light at an interface between the upper layer of the phase shift film and the light shielding film. It was concluded that the above technical problems can be solved by the structure of the phase shift film and the light shielding film as stated above.

That is, the present disclosure is a mask blank having a structure in which a phase shift film and a light shielding film are laminated in this order on a transparent substrate, and further including the following features. The phase shift film has a function to transmit exposure light of an ArF excimer laser at a transmittance of not less than 2% and not more than 30%, and a function to generate a phase difference of not less than 150 degrees and not more than 200 degrees (more preferably, not less than 150 degrees and not more than 180 degrees) between the exposure light transmitted through the phase shift film and the exposure light transmitted through air for the same distance as a thickness of the phase shift film. Additionally, the phase shift film is formed from a material containing silicon and not substantially containing chromium, and includes a structure in which a lower layer and an upper layer are laminated from the transparent substrate side. The lower layer of the phase shift film has a refractive index n lower than the transparent substrate at a wavelength of the exposure light. The upper layer of the phase shift film has a refractive index n higher than the transparent substrate at a wavelength of the exposure light. The lower layer of the phase shift film has an extinction coefficient k higher than the upper layer at a wavelength of the exposure light. The light shielding film includes a layer in contact with the phase shift film. The layer in contact with the phase shift film is formed from a material containing chromium, has a refractive index n lower than the upper layer at a wavelength of the exposure light, and has an extinction coefficient k higher than the upper layer at a wavelength of the exposure light.

FIG. 1 is a cross-sectional view showing a structure of a mask blank 100 according to an embodiment of the present disclosure. The mask blank 100 of the present disclosure shown in FIG. 1 has a structure in which a phase shift film 2, a light shielding film 3, and a hard mask film 4 are laminated in this order on a transparent substrate 1.

The transparent substrate 1 can be formed from quartz glass, aluminosilicate glass, soda-lime glass, low thermal expansion glass (such as $SiO_2$—$TiO_2$ glass), etc. as well as synthetic quartz glass. Among the above, the synthetic quartz glass is particularly preferable as a material forming the transparent substrate 1 of the mask blank 100 since it has a high transmittance to ArF excimer laser light. A refractive index n of the material forming the transparent substrate 1 at a wavelength of ArF exposure light (about 193 nm) is preferably not less than 1.50 and not more than 1.60, more preferably not less than 1.52 and not more than 1.59, and even more preferably not less than 1.54 and not more than 1.58.

The phase shift film 2 is required to have a transmittance of 2% or more to the Arf exposure light. In order to generate a sufficient phase shift effect between the exposure light transmitted through the phase shift film 2 and the exposure light transmitted through the air, the transmittance to the exposure light should be at least 2%. The transmittance of the phase shift film 2 to the exposure light is preferably 3% or more, and more preferably 4% or more. However, as the transmittance of the phase shift film 2 to the exposure light increases, it will be more difficult to increase the back-surface reflectance. Thus, the transmittance of the phase shift film 2 to the exposure light is preferably 30% or less, more preferably 20% or less, and even more preferably 10% or less.

In order to obtain a proper phase shift effect, it is desired for the phase shift film 2 to be adjusted such that the phase difference generated between the ArF exposure light transmitted through the phase shift film 2 and the light transmitted through the air for the same distance as a thickness of the phase shift film 2 is within the range of not less than 150 degrees and not more than 200 degrees. The phase difference of the phase shift film 2 is preferably 155 degrees or more, and more preferably 160 degrees or more. Also, the phase difference of the phase shift film 2 is preferably 190 degrees or less, more preferably 180 degrees or less, and even more preferably 179 degrees or less. This is because it is possible to reduce an influence of increase in phase difference caused by microscopic etching of the transparent substrate 1 upon dry etching in forming a pattern in the phase shift film 2. This is also because recent methods for irradiating a phase shift mask with ArF exposure light by an exposure apparatus often make the ArF exposure light incident from a direction that is oblique at a predetermined angle to a vertical direction of a surface of the phase shift film 2.

The mask blank 100 preferably has a reflectance (back-surface reflectance) of 30% or more when the ArF exposure light is irradiated from the transparent substrate 1 side while the phase shift film 2 and the light shielding film 3 are laminated on the transparent substrate 1. The back-surface reflectance of 30% or more can suppress photoexcitation of silicon atoms in the phase shift film 2 and chromium atoms in the light shielding film 3. This suppressive effect can suppress chromium migration, which is a phenomenon that the chromium atoms in the light shielding film 3 move into the phase shift film 2. On the other hand, if the back-surface reflectance is too high, when the exposure transfer to a transfer target object (such as a resist film on a semiconductor wafer) is conducted using the phase shift mask manufactured from this mask blank 100, an exposure transfer image will be profoundly affected by reflected light on the back surface side of the phase shift mask, which is not preferable. From this viewpoint, the back-surface reflectance is preferably 45% or less, and more preferably 40% or less.

The phase shift film 2 has a structure in which a lower layer 21 and an upper layer 22 are laminated from the transparent substrate 1 side. It is necessary that the entire phase shift film 2 satisfies the above conditions of transmittance and phase difference and the back-surface reflectance in the laminated structure of the phase shift film 2 and the light shielding film 3 satisfies the above described conditions. In order to satisfy these conditions, the refractive index n of the lower layer 21 of the phase shift film 2 should be at least lower than that of the transparent substrate 1. At the same time, the refractive index n of the upper layer 22 should be at least higher than that of the transparent substrate 1. Additionally, the extinction coefficient k of the lower layer 21 should be at least higher than that of the upper layer 22. Incidentally, the upper layer 22 is preferably thicker than the lower layer 21.

In order to satisfy the above described relation between the lower layer 21 and the upper layer 22 of the phase shift film 2, the refractive index n of the lower layer 21 should be 1.50 or less. The refractive index n of the lower layer 21 is preferably 1.45 or less, and more preferably 1.40 or less. Further, the refractive index n of the lower layer 21 is preferably 1.00 or more, and more preferably 1.10 or more. The extinction coefficient k of the lower layer 21 should be 2.00 or more. The extinction coefficient k of the lower layer 21 is preferably 2.20 or more, and more preferably 2.40 or more. Further, the extinction coefficient k of the lower layer 21 is preferably 3.30 or less, and more preferably 3.10 or less. The refractive index n and extinction coefficient k of the lower layer 21 are values derived by regarding the entire lower layer 21 as a single, optically uniform layer.

Also, in order to satisfy the above described relation between the lower layer 21 and the upper layer 22 of the phase shift film 2, the refractive index n of the upper layer 22 should be greater than 2.00. The refractive index n of the upper layer 22 is preferably 2.10 or more. Further, the refractive index n of the upper layer 22 is preferably 3.00 or less, and more preferably 2.80 or less. The extinction coefficient k of the upper layer 22 should be 0.80 or less. The extinction coefficient k of the upper layer 22 is preferably 0.60 or less, and more preferably 0.50 or less. Further, the extinction coefficient k of the upper layer 22 is preferably 0.10 or more, and more preferably 0.20 or more. The refractive index n and extinction coefficient k of the upper layer 22 are values derived by regarding the entire upper layer 22 including a surface layer portion described below as a single, optically uniform layer.

The refractive index n and extinction coefficient k of a thin film including the phase shift film 2 are not determined only by the composition of the thin film. Film density and crystal condition of the thin film are also factors that affect the refractive index n and extinction coefficient k. Thus, the conditions in forming a thin film by reactive sputtering are adjusted so that the thin film reaches desired refractive index n and extinction coefficient k. The condition for making the lower layer 21 and the upper layer 22 within the range of refractive index n and extinction coefficient k mentioned above is not limited to adjustment of the ratio of a noble gas and a reactive gas (such as an oxygen gas or a nitrogen gas) in a mixed gas in forming the film by reactive sputtering, but includes various conditions such as pressure in a film forming chamber, power applied to a sputtering target, positional relationship between the target and the transparent substrate 1 such as distance, etc. in film formation through reactive sputtering. Further, these film forming conditions are specific to a film forming apparatus, and are adjusted arbitrarily so that the lower layer 21 and the upper layer 22 to be formed achieve the desired refractive index n and extinction coefficient k.

The thickness of the entire phase shift film 2 is desirably less than 100 nm. In a mask blank for manufacturing a phase shift mask, bias related to Electro Magnetic Field (EMF) effect is desirably small. This is because reduction in thickness of a thin film pattern of the phase shift mask is effective to decrease the EMF bias. However, it is also necessary to satisfy the above described relation of thickness between the lower layer 21 and the upper layer 22 of the phase shift film 2. Particularly considering the transmittance of the entire phase shift film 2 to the ArF exposure light, the thickness of the lower layer 21 is preferably less than 10 nm, more preferably 9 nm or less, and even more preferably 8 nm or less. Further, particularly considering the back-surface reflectance of the phase shift film 2, the thickness of the lower layer 21 is preferably 3 nm or more, more preferably 4 nm or more, and even more preferably 5 nm or more.

Particularly considering the phase difference and back-surface reflectance of the entire phase shift film 2 to the ArF exposure light, the thickness of the upper layer 22 is preferably 9 times or more the thickness of the lower layer 21, and more preferably 10 times or more. Further, particularly considering that the phase shift film 2 is prepared to have a thickness of less than 100 nm, the thickness of the upper layer 22 is preferably 15 times or less the thickness of the lower layer 21, and more preferably 13 times or less. Also, the thickness of the upper layer 22 is preferably 90 nm or less, and more preferably 80 nm or less.

Both the lower layer 21 and the upper layer 22 of the phase shift film 2 are formed from a material containing silicon and not substantially containing chromium. It is preferable that the phase shift film 2 further contains metallic elements other than chromium. The metallic elements to be contained in the material forming the phase shift film 2 are preferably transition metal elements. The transition metal elements in this case include one or more metallic elements of molybdenum (Mo), tantalum (Ta), tungsten (W), titanium (Ti), hafnium (Hf), nickel (Ni), vanadium (V), zirconium (Zr), ruthenium (Ru), rhodium (Rh), zinc (Zn), niobium (Nb), and palladium (Pd). The metallic elements other than the transition metal elements to be contained in the material forming the phase shift film 2 include, for example, aluminum (Al), indium (In), tin (Sn), and gallium (Ga). In addition to the elements above, the material forming the phase shift film 2 may contain elements such as carbon (C), hydrogen (H), boron (B), germanium (Ge), and antimony (Sb). Further, the material forming the lower layer 21 may contain an inert gas such as helium (He), argon (Ar), krypton (Kr), and xenon (Xe).

The lower layer 21 of the phase shift film 2 is preferably formed from a material which contains metal other than chromium and silicon and which does not substantially contain chromium and oxygen. This is because, while a material having a high extinction coefficient k should be used for the lower layer 21, the increase of oxygen content in the material causes the extinction coefficient k to be significantly lowered, which is undesirable. Thus, the lower layer 21 should be formed from a material not substantially containing oxygen. The material not substantially containing oxygen is a material having the oxygen content of at least 5 atomic % or less. The oxygen content in the material forming the lower layer 21 is preferably 3 atomic % or less, and more preferably not more than the detection lower limit upon composition analysis through, for example, X-ray photoelectron spectroscopy.

The material forming the lower layer 21 may also contain nitrogen. However, as the nitrogen content in the material increases, the refractive index n of the material tends to increase. Further, as the nitrogen content in the material increases, the extinction coefficient k of the material tends to decrease, though not to the extent of decrease due to increase in oxygen content. The material forming the lower layer 21 preferably has a low refractive index n and a high extinction coefficient k. In view of these points, when the lower layer 21 is formed from a material including metal, silicon, and nitrogen, the nitrogen content is preferably 20 atommic % or less, more preferably 19 atomic % or less, and even more preferably 15 atommic % or less. In this case, however, the nitrogen content in the material forming the lower layer 21 is preferably 5 atommic % or more, and more preferably 10 atomic % or more. The lower layer 21 is more preferably formed from a material including metal other than chromium and silicon, or a material including metal other than chromium, silicon, and nitrogen, and even more preferably formed from the material including metal other than chromium and silicon.

The lower layer 21 is preferably formed in contact with a surface of the transparent substrate 1. This is because a structure in which the lower layer 21 contacts the surface of the transparent substrate 1 can improve the effect of enhancing the back-surface reflectance that is generated by the laminated structure of the phase shift film 2 including the lower layer 21 and the upper layer 22 as stated above. An etching stopper film may be provided between the transparent substrate 1 and the phase shift film 2 as long as it has less influence on the effect of enhancing the back-surface reflectance of the phase shift film 2. In this case, the thickness of the etching stopper film needs to be 10 nm or less, preferably 7 nm or less, and more preferably 5 nm or less. From the viewpoint of an effective function as an etching stopper, the thickness of the etching stopper film needs to be 3 nm or more. An extinction coefficient k of a material forming the etching stopper film should be less than 0.1, preferably 0.05 or less, and more preferably 0.01 or less. Further, a refractive index n of the material forming the etching stopper film in this case should at least be 1.9 or less, and preferably 1.7 or less. The refractive index n of the material forming the etching stopper film is preferably 1.55 or more.

The upper layer 22 of the phase shift film 2 is preferably formed from a material which contains metal other than chromium, silicon, nitrogen, and oxygen and which does not substantially contain chromium. Since the lower layer 21 of the phase shift film 2 should be formed from a material with a high extinction coefficient k, the upper layer 22 should contain not only nitrogen but also oxygen in a positive manner. In view of this point, the oxygen content in the material forming the upper layer 22 is preferably higher than 5 atommic %, more preferably 10 atommic % or more, and even more preferably 12 atommic % or more. Oxygen tends to decrease both the refractive index n and extinction coefficient k of a material as the oxygen content in the material increases. Thus, the increase in oxygen content in the upper layer 22 leads to the increase in entire thickness of the phase shift film 2 to be required to ensure the predetermined transmittance and phase difference of the entire phase shift film 2 to the ArF exposure light. In view of these points, the oxygen content in the material forming the upper layer 22 is preferably 30 atommic % or less, more preferably 25 atommic % or less, and even more preferably 20 atommic % or less.

Nitrogen tends to increase the refractive index n and decrease the extinction coefficient k of a material as the nitrogen content in the material increases. The nitrogen content in the material forming the upper layer 22 is preferably 20 atommic % or more, more preferably 25 atommic % or more, and even more preferably 30 atommic % or more. Further, the nitrogen content in the material forming the upper layer 22 is preferably 50 atommic % or less, more preferably 45 atommic % or less, and even more preferably 40 atommic % or less.

A ratio [%] of the metal content [atommic %] divided by the total content of metal and silicon [atommic %] in the material forming the upper layer 22 (hereinafter referred to as "M/[M+Si] ratio") should be lower than the M/[M+Si] ratio of the lower layer 21. When a material has the M/[M+Si] ratio within a range from 0 to about 34%, both the refractive index n and extinction coefficient k tend to increase as the M/[M+Si] ratio increases. A material used for the upper layer 22 should have a tendency to have a high refractive index n and a low extinction coefficient k, and preferably has a low M/[M+Si] ratio. On the other hand, a material used for the lower layer 21 should have a tendency to have a low refractive index n and a high extinction coefficient k, and preferably has a certain high level of M/[M+Si] ratio.

A difference obtained by subtracting the M/[M+Si] ratio in the upper layer 22 from the M/[M+Si] ratio in the lower layer 21 is preferably at least 1% or more. Further, the difference obtained by subtracting the M/[M+Si] ratio in the upper layer 22 from the M/[M+Si] ratio in the lower layer 21 is preferably at least 10% or less, and more preferably 8% or less. The M/[M+Si] ratio in the material forming the lower layer 21 should be at least 8% or more, preferably 9% or more, and more preferably 10% or more. Further, the M/[M+Si] ratio in the material forming the lower layer 21 should be at least 20% or less, preferably 15% or less, and more preferably 12% or less.

From the viewpoint of reduction in variation of transmittance and phase shift amount of the phase shift film 2, it is desirable not only to contain oxygen in the upper layer 22 in advance but also to decrease the metal content in the upper layer 22. However, if the material forming the upper layer 22 of the phase shift film 2 does not contain metallic elements which contribute to the increase in refractive index n and extinction coefficient k, the problem of thickening of the entire phase shift film 2 arises. When the upper layer 22 is formed by a DC sputtering method, there is also a problem of increase in defects due to low conductivity of a metal silicide target. In view of these points, the M/[M+Si] ratio in the upper layer 22 is preferably 2% or more, and more preferably 3% or more. Still, from the viewpoint of reduction in variation of transmittance and phase shift amount of the phase shift film 2 (upper layer 22), the M/[M+Si] ratio in the upper layer 22 is preferably 9% or less, and more preferably 8% or less.

Both the material forming the lower layer 21 and the material forming the upper layer 22 preferably contain the same metallic elements. The upper layer 22 and the lower layer 21 are patterned by dry etching using the same etching gas. Thus, the upper layer 22 and the lower layer 21 are desirably etched in the same etching chamber. If respective materials forming the upper layer 22 and the lower layer 21 contain the same metallic elements, environmental change in the etching chamber can be reduced when the object to be dry-etched changes from the upper layer 22 to the lower layer 21.

While the lower layer 21 and the upper layer 22 of the phase shift film 2 are formed through sputtering, any sputtering such as DC sputtering, RF sputtering, and ion beam sputtering is applicable. Application of DC sputtering is preferable, considering the film forming rate. In the case where the target has low conductivity, while application of RF sputtering or ion beam sputtering is preferable, application of RF sputtering is more preferable considering the film forming rate.

In the steps of forming the lower layer 21 and the upper layer 22 of phase shift film 2, respectively, through sputtering, it is impossible to form the lower layer 21 and the upper layer 22 by the same single target. This is because the respective M/[M+Si] ratios in the lower layer 21 and the upper layer 22 are different from each other. If the lower layer 21 and the upper layer 22 are respectively formed from two targets having different M/[M+Si] ratios, they may be formed in the same film forming chamber or in different film forming chambers. Also, the lower layer 21 and the upper layer 22 having different M/[M+Si] ratios may be formed by the sputtering using a silicon target and a metal silicide target with varying voltage applied to respective targets. If the lower layer 21 and the upper layer 22 are formed in different film forming chambers, these film forming chambers are preferably communicated with each other, for example, via another vacuum chamber therebetween. In this case, the vacuum chamber is preferably coupled to a load lock chamber through which the transparent substrate 1 will pass when introducing the transparent substrate 1 in the atmosphere into the vacuum chamber. Further, it is preferable to provide a transport device (robotic hand) for transporting the transparent substrate 1 between the load lock chamber, vacuum chamber, and respective film forming chambers.

The upper layer 22 desirably has in its surface layer a layer having an oxygen content higher than the portion of the upper layer 22 excluding the surface layer (this layer is hereafter simply referred to as a surface oxidized layer). Various oxidation treatments are applicable as a method of forming the surface oxidized layer of the upper layer 22. The oxidation treatments include, for example, a heat treatment in a gas containing oxygen such as the atmosphere, a light irradiation treatment using a flash lamp, etc. in a gas containing oxygen, and a treatment to bring ozone and oxygen plasma into contact with the surface layer of the upper layer 22. It is particularly preferable to form the surface oxidized layer in the upper layer 22 using the heat treatment or light irradiation treatment using a flash lamp, etc. where an effect to reduce film stress of the phase shift film 2 can be obtained simultaneously. The thickness of the surface oxidized layer of the upper layer 22 is preferably 1 nm or more, and more preferably 1.5 nm or more. Further, the thickness of the surface oxidized layer of the upper layer 22 is preferably 5 nm or less, and more preferably 3 nm or less. The refractive index n and extinction coefficient k of the upper layer 22 described above are mean values for the entire upper layer 22 including the surface oxidized layer. Since a ratio of the surface oxidized layer in the upper layer 22 is considerably low, the existence of the surface oxidized layer has less influence on the refractive index n and extinction coefficient k of the entire upper layer 22.

The lower layer 21 may be formed from a material including silicon, or a material including silicon and one or more elements selected from nonmetallic elements other than oxygen and metalloid elements. The lower layer 21 may contain any metalloid elements in addition to silicon. Among these metalloid elements, it is preferable to contain one or more elements selected from boron, germanium, antimony, and tellurium, since enhancement in conductivity of silicon to be used as a sputtering target can be expected.

The lower layer 21 may contain nonmetallic elements other than oxygen. Among these nonmetallic elements, it is preferable to contain one or more elements selected from nitrogen, carbon, fluorine, and hydrogen. These nonmetallic elements include a noble gas such as helium (He), argon (Ar), krypton (Kr), and xenon (Xe). Oxygen is not contained in the lower layer 21 in a positive manner (when composition analysis is made through, for example, X-ray photoelectron spectroscopy, the oxygen content is preferably not more than the detection lower limit). This is for the purpose of preventing significant reduction of back-surface reflectance of the phase shift film 2, since reduction of extinction coefficient k of the lower layer 21 caused by containing oxygen in the material forming the lower layer 21 is greater compared to other nonmetallic elements.

The lower layer 21 is preferably formed from a material including silicon and nitrogen, or a material containing silicon, nitrogen, and one or more elements selected from nonmetallic elements other than oxygen and metalloid elements. This is because a silicon-based material containing nitrogen has higher light fastness to the ArF exposure light than a silicon-based material free of nitrogen. Another reason is that oxidation of pattern side walls is suppressed when a phase shift pattern is formed in the lower layer 21. However, as the nitrogen content in the material forming the lower layer 21 increases, the refractive index n becomes higher and the extinction coefficient k becomes lower. Therefore, the nitrogen content in the material forming the lower layer 21 is preferably 40 atommic % or less, more preferably 36 atommic % or less, and even more preferably 32 atommic % or less.

The upper layer 22, excluding its surface layer portion, is formed from a material including silicon and nitrogen, or a material containing silicon, nitrogen, and one or more elements selected from nonmetallic elements other than oxygen and metalloid elements. The surface layer portion of the upper layer 22 is located on the side opposite to the lower layer 21 side. After forming the phase shift film 2 on the transparent substrate 1 with a film-forming apparatus, the film surface is subjected to a cleaning treatment. Since the surface layer portion of the upper layer 22 is exposed to cleaning liquid and rinsing liquid during the cleaning treatment, progress of oxidation is inevitable regardless of composition upon film formation. Further, oxidation of the surface layer portion of the upper layer 22 also progresses by exposure of the phase shift film 2 to the atmosphere and subjecting the phase shift film 2 to a heat treatment in the atmosphere. As stated above, it is more preferable for the material of the upper layer 22 to have a higher refractive index n. Since the refractive index n tends to decrease as the oxygen content in the material increases, oxygen is not contained in the upper layer 22, excluding the surface layer portion, in a positive manner upon film formation (when composition analysis is made through, for example, X-ray photoelectron spectroscopy, the oxygen content is preferably not more than the detection lower limit). Thus, the surface layer portion of the upper layer 22 will be formed from the material forming the upper layer 22 excluding the surface layer portion with the addition of oxygen. The surface layer portion of the upper layer 22 may be formed through various oxidation treatments stated above.

The upper layer 22 may contain any metalloid elements in addition to silicon. Among these metalloid elements, it is preferable to contain one or more elements selected from boron, germanium, antimony, and tellurium, since enhancement in conductivity of silicon to be used as a sputtering target can be expected.

The upper layer 22 may contain nonmetallic elements other than oxygen. Among these nonmetallic elements, it is preferable to contain one or more elements selected from nitrogen, carbon, fluorine, and hydrogen. These nonmetallic elements include a noble gas such as helium (He), argon (Ar), krypton (Kr), and xenon (Xe). It is more preferable for the material of the upper layer 22 to have a higher refractive index n, and the refractive index n of a silicon-based material tends to increase as the nitrogen content increases. Therefore, the total content of metalloid and nonmetallic elements contained in the material forming the upper layer 22 is preferably 10 atommic % or less, and more preferably 5 atommic % or less, and it is even more preferable for the material not to contain such elements in a positive manner. On the other hand, for the above reason, it is desired for the nitrogen content in the material forming the upper layer 22 to be at least higher than the nitrogen content in the material forming the lower layer 21. The nitrogen content in the material forming the upper layer 22 is preferably higher than 50 atommic %, more preferably 52 atommic % or more, and even more preferably 55 atommic % or more.

Both the material forming the lower layer 21 and the material forming the upper layer 22 excluding the surface layer portion are preferably comprised of the same elements. The upper layer 22 and the lower layer 21 are patterned by dry etching using the same etching gas. Thus, the upper layer 22 and the lower layer 21 are desirably etched in the same etching chamber. If the respective materials forming the upper layer 22 and the lower layer 21 are comprised of the same elements, environmental change in the etching chamber can be reduced when the object to be dry-etched changes from the upper layer 22 to the lower layer 21. A ratio of the etching rate of the lower layer 21 to the etching rate of the upper layer 22 when the phase shift film 2 is patterned by dry etching with the same etching gas is preferably 3.0 or less, and more preferably 2.5 or less. Further, the ratio of the etching rate of the lower layer 21 to the etching rate of the upper layer 22 when the phase shift film 2 is patterned by dry etching with the same etching gas is preferably 1.0 or more.

The mask blank 100 has a light shielding film 3 on the phase shift film 2. Generally, in a binary transfer mask, an outer peripheral region outside a region where a transfer pattern is formed (transfer pattern forming region) is desired to ensure optical density (OD) of not less than a predetermined value so as to prevent a resist film on a semiconductor wafer from being subjected to an influence of exposure light transmitted through the outer peripheral region when exposure transfer is made on the resist film using an exposure apparatus. This point is similar in the case of a phase shift mask. Generally, the outer peripheral region of a transfer mask including a phase shift mask preferably has OD of 2.8 or more, and more preferably 3.0 or more. The phase shift film 2 has a function to transmit the exposure light at a predetermined transmittance, and it is difficult to ensure the optical density of a predetermined value with the phase shift film 2 alone. Therefore, it is necessary to laminate the light shielding film 3 on the phase shift film 2 at the stage of manufacturing the mask blank 100 in order to ensure lacking optical density. With such a structure of the mask blank 100, a phase shift mask 200 (see FIGS. 2A-2G) ensuring the optical density of the predetermined value in the outer peripheral region can be manufactured by removing the light shielding film 3 in the region where the phase shift effect is used (basically transfer pattern forming region) during manufacture of the phase shift mask 200.

The light shielding film 3 includes a layer at least in contact with the phase shift film 2 (upper layer 22). If the light shielding film 3 is a single layer structure, the single-layer light shielding film 3 itself is the layer in contact with the phase shift film 2 (upper layer 22). If the light shielding film 3 is a laminated structure comprised of two or more layers, its lowermost layer is the layer in contact with the phase shift film 2 (upper layer 22). A material having sufficient etching selectivity to an etching gas used in forming a pattern in the phase shift film 2 should be used for the layer of the light shielding film 3 in contact with the phase shift film 2. Thus, the layer of the light shielding film 3 in contact with the phase shift film 2 is formed from a material containing chromium. The material containing chromium which forms the layer of the light shielding film 3 in contact with the phase shift film 2 can include, in addition to chromium metal, a material containing chromium and one or more elements selected from oxygen, nitrogen, carbon, boron, and fluorine.

While a chromium-based material is generally etched by a mixed gas of a chlorine-based gas and an oxygen gas, the etching rate of the chromium metal to the etching gas is not so high. Considering the enhancement of etching rate to the etching gas that is the mixed gas of the chlorine-based gas and oxygen gas, the material forming the light shielding film 3 preferably contains chromium and one or more elements selected from oxygen, nitrogen, carbon, boron, and fluorine. Further, the material containing chromium which forms the light shielding film 3 may contain one or more elements among molybdenum, indium, and tin. Containing one or more elements among molybdenum, indium, and tin can increase the etching rate to the mixed gas of the chlorine-based gas and oxygen gas.

The layer of the light shielding film 3 in contact with the phase shift film 2 needs to have a refractive index n lower than the upper layer 22 of the phase shift film 2. The refractive index n of the layer of the light shielding film 3 in contact with the phase shift film 2 is preferably 2.00 or less, more preferably less than 2.00, and even more preferably 1.95 or less. Furthermore, the layer of the light shielding film 3 in contact with the phase shift film 2 needs to have an extinction coefficient k higher than the upper layer 22 of the phase shift film 2. The extinction coefficient k of the layer of the light shielding film 3 in contact with the phase shift film 2 is preferably 1.00 or more, more preferably 1.10 or more, and even more preferably 1.20 or more. The above optical properties in the lower layer 21 and upper layer 22 of the phase shift film 2 and the layer of the light shielding film 3 in contact with the phase shift film 2 can achieve the back-surface reflectance of 30% or more to the ArF exposure light. This makes it possible to suppress the photoexcitation of silicon atoms in the phase shift film 2 and chromium atoms in the light shielding film 3.

If the light shielding film 3 is a laminated structure comprised of two or more layers, various materials are applicable to layers of the light shielding film 3 other than the layer in contact with the phase shift film 2 (the lowermost layer). The material containing chromium described above is applicable to the layers of the light shielding film 3 other than the lowermost layer. The layers of the light shielding film 3 other than the lowermost layer may also be formed from a material containing transition metal and silicon. This is because the material containing transition metal and silicon has high light shielding performance, which enables reduction of thickness of the light shielding film 3. The transition metal to be contained in the layers of the light shielding film 3 other than the lowermost layer includes any one metal among molybdenum (Mo), tantalum (Ta), tungsten (W), titanium (Ti), hafnium (Hf), nickel (Ni), vanadium (V), zirconium (Zr), ruthenium (Ru), rhodium (Rh), zinc (Zn), niobium (Nb), palladium (Pd), etc., or an alloy of these metals. Metallic elements other than the transition metal elements to be contained in the layers of the light shielding film 3 other than the lowermost layer include aluminum (Al), indium (In), tin (Sn), gallium (Ga), etc.

In the mask blank 100, a preferable structure is that a hard mask film 4 formed from a material having etching selectivity to an etching gas used in etching the light shielding film 3 is further laminated on the light shielding film 3. Since the hard mask film 4 is not basically subject to the limitation of optical density, the thickness of the hard mask film 4 can be reduced significantly compared to the thickness of the light shielding film 3. Since the thickness of a resist film of an organic material is sufficient as long as the resist film functions as an etching mask until dry etching for forming a pattern in the hard mask film 4 is completed, the thickness can be reduced significantly compared to conventional resist films. Reduction of thickness of a resist film is effective for enhancing resist resolution and preventing collapse of pattern, which is extremely important in addressing requirements for miniaturization.

In the case where the entire light shielding film 3 is formed from the material containing chromium, the hard mask film 4 is preferably formed from a material containing silicon. Since the hard mask film 4 in this case tends to have low adhesiveness with the resist film of an organic material, it is preferable to treat the surface of the hard mask film 4 with hexamethyldisilazane (HMDS) to enhance surface adhesiveness. The hard mask film 4 in this case is more preferably formed from, for example, $SiO_2$, SiN, or SiON.

Further, in the case where the light shielding film 3 is formed from the material containing chromium, a material containing tantalum is also applicable as the material of the hard mask film 4, in addition to the above. The material containing tantalum in this case includes, in addition to tantalum metal, a material containing tantalum and one or more elements selected from nitrogen, oxygen, boron, and carbon, such as Ta, TaN, TaO, TaON, TaBN, TaBO, TaBON, TaCN, TaCO, TaCON, TaBCN, and TaBOCN. Further, in the case where the layers of the light shielding film 3 other than the lowermost layer are formed from the material containing silicon, the hard mask film 4 is preferably formed from the material containing chromium given above.

In the mask blank 100, a resist film of an organic material is preferably formed in contact with a surface of the hard mask film 4 at a thickness of 100 nm or less. In the case of a fine pattern to meet DRAM hp32 nm generation, a sub-resolution assist feature (SRAF) with 40 nm line width may be provided on a transfer pattern (phase shift pattern) to be formed in the hard mask film 4. However, even in this case, a cross-sectional aspect ratio of resist pattern can be as low as 1:2.5, and thus, the collapse and falling off of the resist pattern can be prevented in rinsing and developing the resist film. The resist film more preferably has a thickness of 80 nm or less.

Figure 2A:
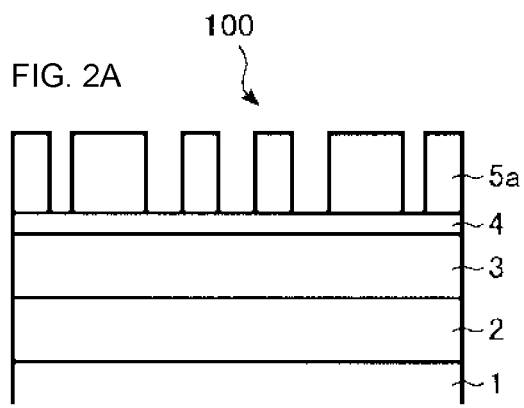
FIGS. 2A to 2G are schematic cross-sectional views showing a manufacturing process of a phase shift mask according to an embodiment of the present disclosure.
Figure 2E:
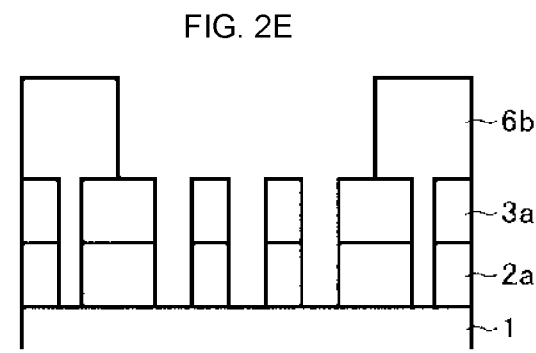
Figure 2B:
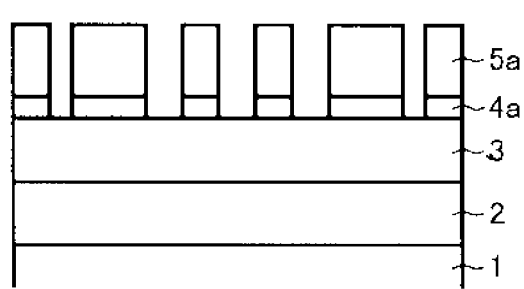
Figure 2F:
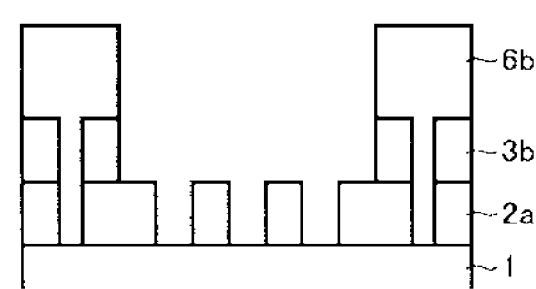
Figure 2C:
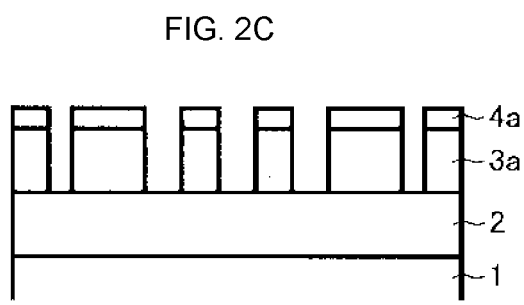
Figure 2G:
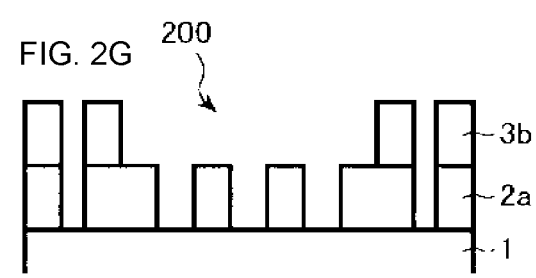
Figure 2D:
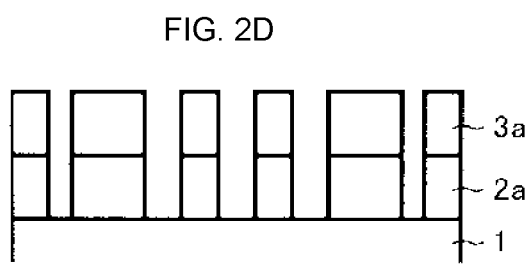

FIGS. 2A-2G show a phase shift mask 200 according to an embodiment of the present disclosure manufactured from the mask blank 100 of the above embodiment, and its manufacturing process. As shown in FIG. 2G, the phase shift mask 200 features a phase shift pattern 2a as a transfer pattern which is formed in the phase shift film 2 of the mask blank 100, and a light shielding pattern 3b formed in the light shielding film 3. If the hard mask film 4 is provided in the mask blank 100, the hard mask film 4 is removed during manufacture of the phase shift mask 200.

The method for manufacturing the phase shift mask 200 according to the embodiment of the present disclosure uses the mask blank 100 mentioned above, and it features the steps of forming a transfer pattern in the light shielding film 3 by dry etching; forming the transfer pattern in the phase shift film 2 by dry etching using as a mask the light shielding film 3 having the transfer pattern; and forming a light shielding pattern 3b in the light shielding film 3 by dry etching using as a mask a second resist pattern 6b that is a resist film having the light shielding pattern. The method for manufacturing the phase shift mask 200 according to the present disclosure is explained below in accordance with the manufacturing process shown in FIGS. 2A-2G. Explained herein is the method for manufacturing the phase shift mask 200 using the mask blank 100 having the hard mask film 4 laminated on the light shielding film 3. In this method described here, the material containing chromium is applied to all the layers of the light shielding film 3 including the layer in contact with the phase shift film 2, and the material containing silicon is applied to the hard mask film 4.

First, a resist film was formed in contact with the hard mask film 4 of the mask blank 100 by a spin coating method. Next, a first pattern, which was a transfer pattern (phase shift pattern) to be formed in the phase shift film 2, was exposed and drawn with electron beams on the resist film, and a predetermined treatment such as developing was conducted, thereby forming a first resist pattern 5a having the phase shift pattern (see FIG. 2A). Subsequently, dry etching with a fluorine-based gas was conducted using the first resist pattern 5a as a mask, and the first pattern (hard mask pattern 4a) was formed in the hard mask film 4 (see FIG. 2B).

Next, after removing the first resist pattern 5a, dry etching with a mixed gas of a chlorine-based gas and an oxygen gas was conducted using the hard mask pattern 4a as a mask, and the first pattern (light shielding pattern 3a) was formed in the light shielding film 3 (see FIG. 2C). Subsequently, dry etching with the fluorine-based gas was conducted using the light shielding pattern 3a as a mask, and then the first pattern (phase shift pattern 2a) was formed in the phase shift film 2, and at the same time the hard mask pattern 4a was removed (see FIG. 2D).

Next, a resist film was formed on the mask blank 100 by the spin coating method. Then, a second pattern, which was a pattern (light shielding pattern) to be formed in the light shielding film 3, was exposed and drawn with electron beams on the resist film, and a predetermined treatment such as developing was conducted, thereby forming a second resist pattern 6b having the light shielding pattern (see FIG. 2E). Subsequently, dry etching with the mixed gas of the chlorine-based gas and oxygen gas was conducted using the second resist pattern 6b as a mask, and the second pattern (light shielding pattern 3b) was formed in the light shielding film 3 (see FIG. 2F). Further, the second resist pattern 6b was removed, a predetermined treatment such as cleaning was carried out, and the phase shift mask 200 was obtained (FIG. 2G).

There is no particular limitation for the chlorine-based gas used for the dry etching described above, as long as Cl is contained. Such a chlorine-based gas includes, for example, $Cl_2$, $SiCl_2$, $CHCl_3$, $CH_2Cl_2$, $CCl_4$, and $BCl_3$. Further, there is no particular limitation for the fluorine-based gas used for the dry etching described above, as long as F is contained. Such a fluorine-based gas includes, for example, $CHF_3$, $CF_4$, $C_2F_6$, $C_4F_8$, and $SF_6$. Particularly, the fluorine-based gas free of C can further reduce damage on a glass substrate since it has a relatively low etching rate to the glass substrate.

The phase shift mask 200 according to the present disclosure is manufactured using the mask blank 100 described above. Thus, in the phase shift film 2 having the transfer pattern formed therein (phase shift pattern 2a), a transmittance to the ArF exposure light is within the range of not less than 2% and not more than 30%, and a phase difference between the exposure light transmitted through the phase shift pattern 2a and the exposure light transmitted through the air for the same distance as a thickness of the phase shift pattern 2a is within the range of not less than 150 degrees and not more than 200 degrees (more preferably not less than 150 degrees and not more than 180 degrees). The phase shift mask 200 has a back-surface reflectance of 30% or more at a region on the transparent substrate 1 in the phase shift pattern 2a on which the light shielding pattern 3b is laminated. This makes it possible to suppress the photoexcitation of silicon atoms in the phase shift pattern 2a and chromium atoms in the light shielding pattern 3b. This also makes it possible to suppress chromium migration, which is a phenomenon that the chromium atoms in the light shielding pattern 3b move into the phase shift pattern 2a.

The phase shift mask 200 preferably has a back-surface reflectance of 45% or less at a region on the transparent substrate 1 in the phase shift pattern 2a on which the light shielding pattern 3b is laminated. This is for the purpose of preventing a large influence on an exposure transfer image due to reflected light on the back-surface side of the phase shift pattern 2a upon the exposure transfer to a transfer target object (such as a resist film on a semiconductor wafer) using the phase shift mask 200.

The method for manufacturing a semiconductor device according to the present disclosure features the exposure transfer of a transfer pattern to a resist film on a semiconductor substrate using the phase shift mask 200 described above. In the phase shift pattern 2a of the phase shift mask 200, an influence of chromium migration can be considerably suppressed. Thus, even if the phase shift mask 200 is set on an exposure apparatus and the step of irradiating ArF exposure light from the transparent substrate 1 side of the phase shift mask 200 and exposure-transferring to a transfer target object (such as a resist film on a semiconductor wafer) is carried out continuously, a desired pattern can be transferred continuously to respective transfer target objects with high precision.

EXAMPLES

The embodiments of the present disclosure are described more specifically below along with examples.

Example 1

Manufacture of Mask Blank

A transparent substrate 1 formed from synthetic quartz glass, which had a main surface dimension of about 152 mm×about 152 mm and a thickness of about 6.35 mm, was prepared. End faces and main surfaces of the transparent substrate 1 had been polished to have predetermined surface roughness, and then subjected to predetermined cleaning and drying treatments. The optical properties of the transparent substrate 1 were measured, and the refractive index n was 1.56 and extinction coefficient k was 0.00.

Next, the transparent substrate 1 was placed in a single-wafer DC sputtering apparatus, and by reactive sputtering (DC sputtering) using a mixed target of molybdenum (Mo) and silicon (Si) (Mo:Si=11 atommic %:89 atommic %) with a mixed gas of argon (Ar) and helium (He) as a sputtering gas, a lower layer 21 of the phase shift film 2 formed from molybdenum and silicon (MoSi film) was formed on the transparent substrate 1 at a thickness of 7 nm.

Then, the transparent substrate 1 having the lower layer 21 formed thereon was placed in the single-wafer DC sputtering apparatus, and by reactive sputtering (DC sputtering) using a mixed target of molybdenum (Mo) and silicon (Si) (Mo:Si=4 atommic %:96 atommic %) with a mixed gas of argon (Ar), nitrogen ($N_2$), oxygen ($O_2$), and helium (He) as a sputtering gas, an upper layer 22 of the phase shift film 2 formed from molybdenum, silicon, nitrogen, and oxygen (MoSiON film) was formed on the lower layer 21 at a thickness of 72 nm. By the above procedure, the phase shift film 2 including the laminated lower and upper layers 21 and 22 was formed in contact with a surface of the transparent substrate 1 at a thickness of 79 nm.

Next, to reduce film stress of the phase shift film 2 and to form an oxidized layer on the surface layer, the transparent substrate 1 having the phase shift film 2 formed thereon was subjected to a heat treatment. In particular, a heating furnace (electric furnace) was used to conduct the heat treatment at a heating temperature of 450° C. in the air for one hour. Another transparent substrate 1, which had a phase shift film 2 including laminated lower and upper layers 21 and 22 on its main surface formed under the same conditions, was prepared and subjected to the heat treatment. The transmittance and phase difference of the phase shift film 2 to the light at a wavelength of 193 nm were measured using a phase shift amount measurement device (MPM193 manufactured by Lasertec Corporation). As a result, the transmittance was 6.0%, and the phase difference was 170.0 degrees. Further, the phase shift film 2 was analyzed by the scanning electron microscope (STEM) and energy dispersive X-ray spectroscopy (EDX), and formation of the oxidized layer having a thickness of about 1.7 nm measured from the surface of the upper layer 22 of the phase shift film 2 was confirmed. Moreover, the optical properties were measured for each of the lower layer 21 and the upper layer 22 of the phase shift film 2. As a result, the lower layer 21 had the refractive index n of 1.15 and the extinction coefficient k of 2.90, and the upper layer 22 had the refractive index n of 2.38 and the extinction coefficient k of 0.31.

Next, the transparent substrate 1 having the phase shift film 2 formed thereon was placed in the single-wafer DC sputtering apparatus, and by reactive sputtering (DC sputtering) using a chromium (Cr) target with a mixed gas of argon (Ar), carbon dioxide ($CO_2$), nitrogen ($N_2$), and helium (He) as a sputtering gas, a light shielding film 3 formed from CrOCN (CrOCN film: Cr:O:C:N=55 atommic %:22 atommic %:12 atommic %:11 atommic %) was formed on the phase shift film 2 at a thickness of 46 nm. In the mask blank 100, the back-surface reflectance (reflectance on the transparent substrate 1 side) to the light at a wavelength of 193 nm while the phase shift film 2 and the light shielding film 3 were laminated on the transparent substrate 1 was 40.9%. The optical density (OD) of the laminated structure of the phase shift film 2 and the light shielding film 3 to the light at a wavelength of 193 nm as measured was 3.0 or more. Further, another transparent substrate 1 was prepared, only a light shielding film 3 was formed under the same film-forming conditions, and the optical properties of the light shielding film 3 were measured. As a result, the refractive index n was 1.95, and the extinction coefficient k was 1.53. The composition of the light shielding film 3 is the result obtained from measurement by X-ray photoelectron spectroscopy (XPS). The same applies to other films hereafter.

Next, the transparent substrate 1 with the phase shift film 2 and the light shielding film 3 laminated thereon was placed in a single-wafer RF sputtering apparatus, and by RF sputtering using a silicon dioxide ($SiO_2$) target with an argon (Ar) gas as a sputtering gas, a hard mask film 4 formed from silicon and oxygen was formed on the light shielding film 3 at a thickness of 5 nm. Through the above procedure, the mask blank 100 having a structure in which the phase shift film 2 of a two-layer structure, the light shielding film 3, and the hard mask film 4 were laminated on the transparent substrate 1 was manufactured.

Manufacture of Phase Shift Mask

Then, a phase shift mask 200 of Example 1 was manufactured through the following procedure using the mask blank 100 of Example 1. First, a surface of the hard mask film 4 was subjected to the HMDS treatment. Subsequently, a resist film made of a chemically amplified resist for electron beam writing was formed in contact with a surface of the hard mask film 4 by the spin coating method at a thickness of 80 nm. Next, a first pattern, which was a phase shift pattern to be formed in the phase shift film 2, was drawn on the resist film with electron beams, predetermined cleaning and developing treatments were conducted, and a first resist pattern 5a having the first pattern was formed (see FIG. 2A).

Next, dry etching with a $CF_4$ gas was conducted using the first resist pattern 5a as a mask, and the first pattern (hard mask pattern 4a) was formed in the hard mask film 4 (see FIG. 2B).

Then, the first resist pattern 5a was removed. Subsequently, dry etching with a mixed gas of chlorine and oxygen (gas flow ratio of $Cl_2:O_2=4:1$) was conducted using the hard mask pattern 4a as a mask, and the first pattern (light shielding pattern 3a) was formed in the light shielding film 3 (see FIG. 2C). Next, dry etching with the fluorine-based gas ($SF_6$+He) was conducted using the light shielding pattern 3a as a mask, and then the first pattern (phase shift pattern 2a) was formed in the phase shift film 2, and at the same time the hard mask pattern 4a was removed (see FIG. 2D).

Next, a resist film made of a chemically amplified resist for electron beam writing was formed on the light shielding pattern 3a by the spin coating method at a thickness of 150 nm. Then, a second pattern, which was a pattern (light shielding band pattern) to be formed in the light shielding film, was exposed and drawn on the resist film, a predetermined treatment such as developing was further conducted, and a second resist pattern 6b having the light shielding pattern was formed (see FIG. 2E). Subsequently, dry etching with the mixed gas of chlorine and oxygen (gas flow ratio of $Cl_2:O_2=4:1$) was conducted using the second resist pattern 6b as a mask, and the second pattern was formed in the light shielding film 3 (see FIG. 2F). Further, the second resist pattern 6b was removed, a predetermined treatment such as cleaning was carried out, and the phase shift mask 200 was obtained (see FIG. 2G).

A region of the phase shift pattern 2a on which the light shielding pattern 3b was laminated in the manufactured phase shift mask 200 of Example 1 was subjected to an irradiation treatment in which ArF excimer laser light was intermittently irradiated until an accumulated irradiation amount reached 40 kJ/$cm^2$. Using AIMS193 (manufactured by Carl Zeiss), a simulation of an exposure transfer image upon the exposure transfer to a resist film on a semiconductor device with the exposure light at a wavelength of 193 nm was performed on the phase shift mask 200 after the irradiation treatment. As a result of inspection of the exposure transfer image obtained by the simulation, it was found that the design specification was fully satisfied. It can be considered from this result that the exposure transfer can be made on the resist film on the semiconductor device with high precision, even if the phase shift mask 200 manufactured from the mask blank 100 of Example 1 was set on an exposure apparatus and subjected to exposure transfer by exposure light of an ArF excimer laser until the accumulated irradiation amount reached 40 kJ/$cm^2$.

Further, measurement by secondary ion mass spectrometry (SIMS) was made on the irradiated region of the phase shift pattern 2a of the phase shift mask 200 of Example 1. As a result, it was found that the phase shift pattern 2a contained a slight amount of chromium. It can be considered from this result that the phase shift mask 200 manufactured from the mask blank 100 of Example 1 can sufficiently suppress a phenomenon of movement of chromium in the light shielding pattern 3b into the phase shift pattern 2a (chromium migration) even if exposure light of the ArF excimer laser is irradiated on the phase shift pattern 2a on which the light shielding pattern 3b is laminated.

Example 2

Manufacture of Mask Blank

The mask blank 100 of Example 2 was manufactured through a procedure similar to Example 1, except for the phase shift film 2. The changes made in the phase shift film 2 of Example 2 are the respective materials forming the lower layer 21 and the upper layer 22, and their thickness. Specifically, the transparent substrate 1 was placed in a single-wafer DC sputtering apparatus, and by reactive sputtering (DC sputtering) using a mixed target of molybdenum (Mo) and silicon (Si) (Mo:Si=11 atommic %:89 atommic %) with a mixed gas of argon (Ar), nitrogen ($N_2$), and helium (He) as a sputtering gas, a lower layer 21 of the phase shift film 2 formed from molybdenum, silicon, and nitrogen (MoSiN film) was formed on the transparent substrate 1 at a thickness of 7 nm.

Next, the transparent substrate 1 having the lower layer 21 formed thereon was placed in the single-wafer DC sputtering apparatus, and by reactive sputtering (DC sputtering)

using a mixed target of molybdenum (Mo) and silicon (Si) (Mo:Si=8 atommic %:92 atommic %) with a mixed gas of argon (Ar), nitrogen ($N_2$), oxygen ($O_2$), and helium (He) as a sputtering gas, an upper layer 22 of the phase shift film 2 formed from molybdenum, silicon, nitrogen, and oxygen (MoSiON film) was formed on the lower layer 21 at a thickness of 88 nm. By the above procedure, the phase shift film 2 including the laminated lower and upper layers 21 and 22 was formed in contact with a surface of the transparent substrate 1 at a thickness of 95 nm.

Further, the phase shift film 2 of Example 2 was also subjected to the heat treatment under the treatment conditions similar to Example 1. Another transparent substrate 1, which had the phase shift film 2 of Example 2 on its main surface formed under the same conditions, was prepared and subjected to the heat treatment. The transmittance and phase difference of the phase shift film 2 to the light at a wavelength of 193 nm were measured using a phase shift amount measurement device (MPM193 manufactured by Lasertec Corporation). As a result, the transmittance was 6.0%, and the phase difference was 170.4 degrees. Further, the phase shift film 2 was analyzed by STEM and EDX, and formation of an oxidized layer having a thickness of about 1.6 nm measured from the surface of the upper layer 22 of the phase shift film 2 was confirmed. Moreover, the optical properties were measured for each of the lower layer 21 and the upper layer 22 of the phase shift film 2. As a result, the lower layer 21 had the refractive index n of 1.34 and the extinction coefficient k of 2.79, and the upper layer 22 had the refractive index n of 2.13 and the extinction coefficient k of 0.28.

By the above procedure, the mask blank 100 of Example 2 was manufactured, the mask blank 100 having a structure in which the phase shift film 2 including the lower layer 21 of MoSiN and the upper layer 22 of MoSiON, the light shielding film 3 having a single-layer structure of CrOCN, and the hard mask film 4 were laminated on the transparent substrate 1. In the mask blank 100, the back-surface reflectance (reflectance on the transparent substrate 1 side) to the light at a wavelength of 193 nm while the phase shift film 2 and the light shielding film 3 were laminated on the transparent substrate 1 was 36.5%. The optical density (OD) of the laminated structure of the phase shift film 2 and the light shielding film 3 to the light at a wavelength of 193 nm as measured was 3.0 or more.

Manufacture of Phase Shift Mask

Next, the phase shift mask 200 of Example 2 was manufactured through a procedure similar to Example 1 using the mask blank 100 of Example 2.

A region of the phase shift pattern 2a on which the light shielding pattern 3b was laminated in the manufactured phase shift mask 200 of Example 2 was subjected to an irradiation treatment in which ArF excimer laser light was intermittently irradiated until an accumulated irradiation amount reached 40 kJ/cm$^2$. Using AIMS193 (manufactured by Carl Zeiss), a simulation of an exposure transfer image upon the exposure transfer to a resist film on a semiconductor device with the exposure light at a wavelength of 193 nm was performed on the phase shift mask 200 after the irradiation treatment. As a result of inspection of the exposure transfer image obtained by the simulation, it was found that the design specification was fully satisfied. It can be considered from this result that the exposure transfer can be made on the resist film on the semiconductor device with high precision, even if the phase shift mask 200 manufactured from the mask blank 100 of Example 2 was set on an exposure apparatus and subjected to exposure transfer by exposure light of an ArF excimer laser until the accumulated irradiation amount reached 40 kJ/cm$^2$.

Further, measurement by secondary ion mass spectrometry (SIMS) was made on the irradiated region of the phase shift pattern 2a of the half tone phase shift mask 200 of Example 2. As a result, it was found that the phase shift pattern 2a contained a slight amount of chromium. It can be considered from this result that the phase shift mask 200 manufactured from the mask blank 100 of Example 2 can sufficiently suppress a phenomenon of movement of chromium in the light shielding pattern 3b into the phase shift pattern 2a (chromium migration) even if exposure light of the ArF excimer laser is irradiated on the phase shift pattern 2a on which the light shielding pattern 3b is laminated.

Example 3

Manufacture of Mask Blank

The mask blank 100 of Example 3 was manufactured through a procedure similar to Example 1, except for the light shielding film 3. The light shielding film 3 of Example 3 has a structure in which a lowermost layer (layer in contact with the phase shift film 2) and an upper layer are laminated from the phase shift film 2 side. Specifically, the transparent substrate 1 having the phase shift film 2 formed thereon was placed in a single-wafer DC sputtering apparatus, and by reactive sputtering (DC sputtering) using a chromium (Cr) target with a mixed gas of argon (Ar), nitrogen ($N_2$), carbon dioxide ($CO_2$), and helium (He) as a sputtering gas, the lowermost layer of the light shielding film 3 formed from chromium, oxygen, nitrogen, and carbon (CrOCN film: Cr:O:C:N=49 atommic %:24 atommic %:13 atommic %:14 atommic %) was formed on the phase shift film 2 at a thickness of 47 nm. Subsequently, by reactive sputtering (DC sputtering) also using a chromium (Cr) target with a mixed gas of argon (Ar) and nitrogen ($N_2$) as a sputtering gas, the upper layer of the light shielding film 3 formed from chromium and nitrogen (CrN film: Cr:N=76 atommic %:24 atommic %) was formed on the lowermost layer at a thickness of 5 nm.

By the above procedure, the mask blank 100 of Example 3 was manufactured, the mask blank 100 having a structure in which the phase shift film 2 including the lower layer 21 of MoSi and the upper layer 22 of MoSiON, the light shielding film 3 including the lowermost layer of CrOCN and the upper layer of CrN, and the hard mask film 4 were laminated on the transparent substrate. In the mask blank 100, the back-surface reflectance (reflectance on the transparent substrate 1 side) to the light at a wavelength of 193 nm while the phase shift film 2 and the light shielding film 3 were laminated on the transparent substrate 1 was 40.9%. The optical density (OD) of the laminated structure of the phase shift film 2 and the light shielding film 3 to the light at a wavelength of 193 nm as measured was 3.0 or more. Further, another transparent substrate 1 was prepared, only a light shielding film 3 was formed under the same film-forming conditions, and the optical properties of the light shielding film 3 were measured. As a result, the lowermost layer of the light shielding film 3 had a refractive index n of 1.78 and an extinction coefficient k of 1.20. The upper layer of the light shielding film 3 had a refractive index n of 1.55 and an extinction coefficient k of 1.68.

Manufacture of Phase Shift Mask

Next, the phase shift mask 200 of Example 3 was manufactured through a procedure similar to Example 1 using the mask blank 100 of Example 3.

A region of the phase shift pattern 2a on which the light shielding pattern 3b was laminated in the manufactured phase shift mask 200 of Example 3 was subjected to an irradiation treatment in which ArF excimer laser light was intermittently irradiated until an accumulated irradiation amount reached 40 kJ/cm$^2$. Using AIMS193 (manufactured by Carl Zeiss), a simulation of an exposure transfer image upon the exposure transfer to a resist film on a semiconductor device with the exposure light at a wavelength of 193 nm was performed on the phase shift mask 200 after the irradiation treatment. As a result of inspection of the exposure transfer image obtained by the simulation, it was found that the design specification was fully satisfied. It can be considered from this result that the exposure transfer can be made on the resist film on the semiconductor device with high precision, even if the phase shift mask 200 manufactured from the mask blank 100 of Example 3 was set on an exposure apparatus and subjected to exposure transfer by exposure light of an ArF excimer laser until the accumulated irradiation amount reached 40 kJ/cm$^2$.

Further, measurement by secondary ion mass spectrometry (SIMS) was made on the irradiated region of the phase shift pattern 2a of the half tone phase shift mask 200 of Example 3. As a result, it was found that the phase shift pattern 2a contained a slight amount of chromium. It can be considered from this result that the phase shift mask 200 manufactured from the mask blank 100 of Example 3 can sufficiently suppress a phenomenon of movement of chromium in the light shielding pattern 3b into the phase shift pattern 2a (chromium migration) even if exposure light of the ArF excimer laser is irradiated on the phase shift pattern 2a on which the light shielding pattern 3b is laminated.

Example 4

Manufacture of Mask Blank

The mask blank 100 of Example 4 was manufactured through a procedure similar to Example 2, except for the light shielding film 3. The light shielding film 3 of Example 4 was the same as the light shielding film 3 of Example 3. By the above procedure, the mask blank 100 of Example 4 was manufactured, the mask blank 100 having a structure in which the phase shift film 2 including the lower layer 21 of MoSiN and the upper layer 22 of MoSiON, the light shielding film 3 including the lowermost layer of CrOCN and the upper layer of CrN, and the hard mask film 4 were laminated on the transparent substrate. In the mask blank 100, the back-surface reflectance (reflectance on the transparent substrate 1 side) to the light at a wavelength of 193 nm while the phase shift film 2 and the light shielding film 3 were laminated on the transparent substrate 1 was 34.9%. The optical density (OD) of the laminated structure of the phase shift film 2 and the light shielding film 3 to the light at a wavelength of 193 nm as measured was 3.0 or more.

Manufacture of Phase Shift Mask

Next, the phase shift mask 200 of Example 4 was manufactured through a procedure similar to Example 1 using the mask blank 100 of Example 4.

A region of the phase shift pattern 2a on which the light shielding pattern 3b was laminated in the manufactured phase shift mask 200 of Example 4 was subjected to an irradiation treatment in which ArF excimer laser light was intermittently irradiated until an accumulated irradiation amount reached 40 kJ/cm$^2$. Using AIMS193 (manufactured by Carl Zeiss), a simulation of an exposure transfer image upon the exposure transfer to a resist film on a semiconductor device with the exposure light at a wavelength of 193 nm was performed on the phase shift mask 200 after the irradiation treatment. As a result of inspection of the exposure transfer image obtained by the simulation, it was found that the design specification was fully satisfied. It can be considered from this result that the exposure transfer can be made on the resist film on the semiconductor device with high precision, even if the phase shift mask 200 manufactured from the mask blank 100 of Example 4 was set on an exposure apparatus and subjected to exposure transfer by exposure light of an ArF excimer laser until the accumulated irradiation amount reached 40 kJ/cm$^2$.

Further, measurement by secondary ion mass spectrometry (SIMS) was made on the irradiated region of the phase shift pattern 2a of the half tone phase shift mask 200 of Example 4. As a result, it was found that the phase shift pattern 2a contained a slight amount of chromium. It can be considered from this result that the phase shift mask 200 manufactured from the mask blank 100 of Example 4 can sufficiently suppress a phenomenon of movement of chromium in the light shielding pattern 3b into the phase shift pattern 2a (chromium migration) even if exposure light of the ArF excimer laser is irradiated on the phase shift pattern 2a on which the light shielding pattern 3b is laminated.

Example 5

Manufacture of Mask Blank

The mask blank 100 of Example 5 was manufactured through a procedure similar to Example 1, except for the phase shift film 2. The changes made in the phase shift film 2 of Example 5 are the respective materials forming the lower layer 21 and the upper layer 22, and their thickness. Specifically, the transparent substrate 1 was placed in a single-wafer RF sputtering apparatus, and by RF sputtering using a silicon (Si) target with an argon (Ar) gas as a sputtering gas, the lower layer 21 of the phase shift film 2 formed from silicon (Si film) was formed in contact with a surface of the transparent substrate 1 at a thickness of 8 nm. Subsequently, by reactive sputtering (RF sputtering) using a silicon (Si) target with a mixed gas of argon (Ar) and nitrogen (N$_2$) as a sputtering gas, the upper layer 22 of the phase shift film 2 formed from silicon and nitrogen (SiN film: Si:N=43 atommic %:57 atommic %) was formed on the lower layer 21 at a thickness of 63 nm. By the above procedure, the phase shift film 2 including the laminated lower and upper layers 21 and 22 was formed in contact with the surface of the transparent substrate 1 at a thickness of 71 nm.

Further, to reduce film stress of the phase shift film 2 and to form an oxidized layer on the surface layer portion, the transparent substrate 1 having the phase shift film 2 formed thereon was subjected to a heat treatment. The transmittance and phase difference of the phase shift film 2 to the light at a wavelength of 193 nm were measured using a phase shift amount measurement device (MPM193 manufactured by Lasertec Corporation). As a result, the transmittance was 6.1%, and the phase difference was 177.0 degrees. Further, the phase shift film 2 was analyzed by STEM and EDX, and formation of the oxidized layer in the surface layer portion at a thickness of about 2 nm from the surface of the upper layer 22 was confirmed.

By the above procedure, the mask blank 100 of Example 5 was manufactured, the mask blank 100 having a structure in which the phase shift film 2 including the lower layer 21 of Si and the upper layer 22 of SiN, the light shielding film 3 having a single-layer structure of CrOCN, and the hard mask film 4 were laminated on the transparent substrate 1. In the mask blank 100, the back-surface reflectance (reflectance on the transparent substrate 1 side) to the light at a wavelength of 193 nm while the phase shift film 2 and the light shielding film 3 were laminated on the transparent substrate 1 was 42.7%. The optical density (OD) of the laminated structure of the phase shift film 2 and the light shielding film 3 to the light at a wavelength of 193 nm as measured was 3.0 or more. Further, another transparent substrate 1 was prepared, only a phase shift film 2 was formed under the same film-forming conditions, and the optical properties of the phase shift film 2 were measured. As a result, the lower layer 21 had a refractive index n of 1.06 and an extinction coefficient k of 2.72, and the upper layer 22 had a refractive index n of 2.63 and an extinction coefficient k of 0.37.

Manufacture of Phase Shift Mask

Next, the phase shift mask 200 of Example 5 was manufactured through a procedure similar to Example 1 using the mask blank 100 of Example 5.

A region of the phase shift pattern 2a on which the light shielding pattern 3b was laminated in the manufactured phase shift mask 200 of Example 5 was subjected to an irradiation treatment in which ArF excimer laser light was intermittently irradiated until an accumulated irradiation amount reached 40 kJ/cm$^2$. Using AIMS193 (manufactured by Carl Zeiss), a simulation of an exposure transfer image upon the exposure transfer to a resist film on a semiconductor device with the exposure light at a wavelength of 193 nm was performed on the phase shift mask 200 after the irradiation treatment. As a result of inspection of the exposure transfer image obtained by the simulation, it was found that the design specification was fully satisfied. It can be considered from this result that the exposure transfer can be made on the resist film on the semiconductor device with high precision, even if the phase shift mask 200 manufactured from the mask blank 100 of Example 5 was set on an exposure apparatus and subjected to exposure transfer by exposure light of an ArF excimer laser until the accumulated irradiation amount reached 40 kJ/cm$^2$.

Further, measurement by secondary ion mass spectrometry (SIMS) was made on the irradiated region of the phase shift pattern 2a of the half tone phase shift mask 200 of Example 5. As a result, it was found that the phase shift pattern 2a contained a slight amount of chromium. It can be considered from this result that the phase shift mask 200 manufactured from the mask blank 100 of Example 5 can sufficiently suppress a phenomenon of movement of chromium in the light shielding pattern 3b into the phase shift pattern 2a (chromium migration) even if exposure light of the ArF excimer laser is irradiated on the phase shift pattern 2a on which the light shielding pattern 3b is laminated.

Comparative Example 1

Manufacture of Mask Blank

The mask blank of Comparative Example 1 was manufactured through a procedure similar to Example 1, except for the phase shift film 2. A film of a single layer structure made of molybdenum, silicon, and nitrogen was used as the phase shift film of Comparative Example 1. Specifically, the transparent substrate 1 was placed in a single-wafer DC sputtering apparatus, and by reactive sputtering (DC sputtering) using a mixed sintered target of molybdenum (Mo) and silicon (Si) (Mo:Si=11 atommic %:89 atommic %) with a mixed gas of argon (Ar), nitrogen (N$_2$), and helium (He) as a sputtering gas, the phase shift film 2 formed from molybdenum, silicon, and nitrogen was formed at a thickness of 69 nm.

Further, this phase shift film was also subjected to the heat treatment under the treatment conditions similar to Example 1. Another transparent substrate 1, which had the phase shift film of Comparative Example 1 on its main surface formed under the same conditions, was prepared and subjected to the heat treatment. The transmittance and phase difference of the phase shift film to the light at a wavelength of 193 nm were measured using a phase shift amount measurement device (MPM193 manufactured by Lasertec Corporation). As a result, the transmittance was 6.1%, and the phase difference was 177.0 degrees. Further, the phase shift film was analyzed by STEM and EDX, and formation of an oxidized layer having a thickness of about 2 nm measured from the surface of the phase shift film was confirmed.

By the above procedure, the mask blank of Comparative Example 1 was manufactured, the mask blank having a structure in which the phase shift film of MoSiN, a light shielding film having a single layer structure of CrOCN, and a hard mask film were laminated on the transparent substrate 1. In the mask blank, the back-surface reflectance (reflectance on the transparent substrate 1 side) to the light at a wavelength of 193 nm while the phase shift film and the light shielding film were laminated on the transparent substrate 1 was 11.0%. The optical density (OD) of the laminated structure of the phase shift film and the light shielding film to the light at a wavelength of 193 nm as measured was 3.0 or more. Further, another transparent substrate was prepared, only a phase shift film was formed under the same film-forming conditions, and the optical properties of the phase shift film were measured. As a result, the refractive index n was 2.39, and the extinction coefficient k was 0.57.

Manufacture of Phase Shift Mask

Next, the phase shift mask of Comparative Example 1 was manufactured through a procedure similar to Example 1 using the mask blank of Comparative Example 1.

A region of the phase shift pattern on which the light shielding pattern was laminated in the manufactured phase shift mask of Comparative Example 1 was subjected to an irradiation treatment in which ArF excimer laser light was intermittently irradiated until an accumulated irradiation amount reached 40 kJ/cm$^2$. Using AIMS193 (manufactured by Carl Zeiss), a simulation of an exposure transfer image upon the exposure transfer to a resist film on a semiconductor device with the exposure light at a wavelength of 193 nm was performed on the phase shift mask after the irradiation treatment. As a result of inspection of the exposure transfer image obtained by the simulation, it was found that the design specification was not satisfied. It can be considered from this result that a highly precise exposure transfer cannot be made on the resist film on the semiconductor device when the phase shift mask manufactured from the mask blank of Comparative Example 1 was set on an exposure apparatus and subjected to exposure transfer by exposure light of an ArF excimer laser until the accumulated irradiation amount reached 40 kJ/cm².

Further, the region of the phase shift pattern on which the light shielding pattern was laminated in the phase shift mask of Comparative Example 1 was subjected to an irradiation treatment in which ArF excimer laser light was intermittently irradiated until an accumulated irradiation amount reached 40 kJ/cm². Secondary ion mass spectrometry (SIMS) was conducted on the irradiated region of the phase shift pattern. As a result, it was found that the chromium content in the phase shift pattern was significantly higher than the results in Examples. It can be considered from this result that the phase shift mask manufactured from the mask blank of Comparative Example 1 cannot suppress movement of chromium in the light shielding pattern into the phase shift pattern when exposure light of the ArF excimer laser is irradiated on the phase shift pattern on which the light shielding pattern is laminated.

DESCRIPTION OF REFERENCE NUMERALS

1: transparent substrate
2: phase shift film
21: lower layer
22: upper layer
2a: phase shift pattern
3: light shielding film
3a, 3b: light shielding pattern
4: hard mask film
4a: hard mask pattern
5a: first resist pattern
6b: second resist pattern
100: mask blank
200: phase shift mask

What is claimed is:

1. A mask blank comprising:
   a transparent substrate,
   a phase shift film provided on the transparent substrate, and
   a light shielding film provided on the phase shift film,
   wherein the phase shift film is configured to transmit exposure light at a transmittance of not less than 2% and not more than 30% and to generate a phase difference of not less than 150 degrees and not more than 200 degrees between the exposure light transmitted through the phase shift film and exposure light transmitted through air for the same distance as a thickness of the phase shift film, and
   wherein the phase shift film is formed from a material containing silicon and not substantially containing chromium and includes a structure in which a lower layer and an upper layer are laminated from the transparent substrate side, and
   wherein the light shielding film includes a layer in contact with the phase shift film, and
   wherein the layer in contact with the phase shift film is formed from a material containing chromium, and
   wherein a reflectance to exposure light entering from the transparent substrate side in a state where the phase shift film and the light shielding film are provided is 30% or more.

2. The mask blank according to claim 1, wherein the upper layer has a thickness greater than that of the lower layer.

3. The mask blank according to claim 1, wherein the lower layer has a thickness of less than 10 nm.

4. The mask blank according to claim 1, wherein the lower layer has a refractive index n at a wavelength of the exposure light lower than that of the transparent substrate.

5. The mask blank according to claim 1, wherein the upper layer has a refractive index n at a wavelength of the exposure light greater than that of the transparent substrate.

6. The mask blank according to claim 1, wherein the lower layer has an extinction coefficient k at a wavelength of the exposure light greater than that of the upper layer.

7. The mask blank according to claim 1, wherein the layer in contact with the phase shift film has a refractive index n at a wavelength of the exposure light lower than that of the upper layer and an extinction coefficient k at a wavelength of the exposure light greater than that of the upper layer.

8. The mask blank according to claim 1, wherein the lower layer and the upper layer include metallic elements except chromium, and
   wherein a ratio [%] of metal content [atom %] divided by total content of metal and silicon [atom %] in the material forming the upper layer is lower than a ratio [%] of metal content [atom %] divided by total content of metal and silicon [atom %] in the material forming the lower layer.

9. The mask blank according to claim 8, wherein the material forming the lower layer has a nitrogen content of 20 atom % or less, and wherein the material forming the upper layer has a nitrogen content of 20 atom % or more.

10. The mask blank according to claim 1, wherein the lower layer is formed from a material made from silicon or a material made from silicon containing one or more elements selected from nonmetallic elements other than oxygen and metalloid elements, and
    wherein the upper layer, excluding its surface layer portion, is formed from a material made from silicon or a material made from silicon containing one or more elements selected from nonmetallic elements other than oxygen and metalloid elements, and
    wherein the material forming the lower layer has a nitrogen content of 40 atom % or less, and
    wherein the material forming the upper layer has a nitrogen content of 50 atom % or more.

11. The mask blank according to claim 1, wherein the lower layer is formed in contact with a surface of the transparent substrate.

12. The mask blank according to claim 1, wherein the upper layer has, in its surface layer, a layer having an oxygen content higher than in a portion of the upper layer excluding the surface layer.

13. A phase shift mask comprising:
    a transparent substrate;
    a phase shift film provided on the transparent substrate and having a transfer pattern formed therein; and
    a light shielding film provided on the phase shift film and having a light shielding pattern formed therein,
    wherein the phase shift film is configured to transmit exposure light at a transmittance of not less than 2% and not more than 30% and to generate a phase difference of not less than 150 degrees and not more than 200 degrees between the exposure light transmitted through the phase shift film and exposure light transmitted through air for the same distance as a thickness of the phase shift film, and
    wherein the phase shift film is formed from a material containing silicon and not substantially containing chromium and includes a structure in which a lower layer and an upper layer are laminated from the transparent substrate side, and wherein the light shielding film includes a layer in contact with the phase shift film, and wherein the layer in contact with the phase shift film is formed from a material containing chromium, and wherein a reflectance to exposure light entering from the transparent substrate side in a state where the phase shift film and the light shielding film are provided is 30% or more.

14. The phase shift mask according to claim 13, wherein the upper layer has a thickness greater than that of the lower layer.

15. The phase shift mask according to claim 13, wherein the lower layer has a thickness of less than 10 nm.

16. The phase shift mask according to claim 13, wherein the lower layer has a refractive index n at a wavelength of the exposure light lower than that of the transparent substrate.

17. The phase shift mask according to claim 13, wherein the upper layer has a refractive index n at a wavelength of the exposure light greater than that of the transparent substrate.

18. The phase shift mask according to claim 13, wherein the lower layer has an extinction coefficient k at a wavelength of the exposure light greater than that of the upper layer.

19. The phase shift mask according to claim 13, wherein the layer in contact with the phase shift film has a refractive index n at a wavelength of the exposure light lower than that of the upper layer and an extinction coefficient k at a wavelength of the exposure light greater than that of the upper layer.

20. The phase shift mask according to claim 13, wherein the lower layer and the upper layer include metallic elements except chromium, and wherein a ratio [%] of metal content [atom %] divided by total content of metal and silicon [atom %] in the material forming the upper layer is lower than a ratio [%] of metal content [atom %] divided by total content of metal and silicon [atom %] in the material forming the lower layer.

21. The phase shift mask according to claim 20, wherein the material forming the lower layer has a nitrogen content of 20 atom % or less, and wherein the material forming the upper layer has a nitrogen content of 20 atom % or more.

22. The phase shift mask according to claim 13, wherein the lower layer is formed from a material made from silicon or a material made from silicon containing one or more elements selected from nonmetallic elements other than oxygen and metalloid elements, and wherein the upper layer, excluding its surface layer portion, is formed from a material made from silicon or a material made from silicon containing one or more elements selected from nonmetallic elements other than oxygen and metalloid elements, and wherein the material forming the lower layer has a nitrogen content of 40 atom % or less, and wherein the material forming the upper layer has a nitrogen content of 50 atom % or more.

23. The phase shift mask according to claim 13, wherein the lower layer is formed in contact with a surface of the transparent substrate.

24. The phase shift mask according to claim 13, wherein the upper layer has, in its surface layer, a layer having an oxygen content higher than in a portion of the upper layer excluding the surface layer.

25. A method for manufacturing a semiconductor device comprising exposure-transferring a transfer pattern to a resist film on a semiconductor substrate using a phase shift mask, wherein the phase shift mask comprises a transparent substrate, a phase shift film provided on the transparent substrate and having a transfer pattern formed therein, and a light shielding film provided on the phase shift film and having a light shielding pattern formed therein, and wherein the phase shift film is configured to transmit exposure light at a transmittance of not less than 2% and not more than 30% and to generate a phase difference of not less than 150 degrees and not more than 200 degrees between the exposure light transmitted through the phase shift film and exposure light transmitted through air for the same distance as a thickness of the phase shift film, and wherein the phase shift film is formed from a material containing silicon and not substantially containing chromium and includes a structure in which a lower layer and an upper layer are laminated from the transparent substrate side, and wherein the light shielding film includes a layer in contact with the phase shift film, and wherein the layer in contact with the phase shift film is formed from a material containing chromium, and wherein a reflectance to exposure light entering from the transparent substrate side in a state where the phase shift film and the light shielding film are provided is 30% or more.

* * * * *